(12) United States Patent
Freeman et al.

(10) Patent No.: US 7,355,221 B2
(45) Date of Patent: Apr. 8, 2008

(54) FIELD EFFECT TRANSISTOR HAVING AN ASYMMETRICALLY STRESSED CHANNEL REGION

(75) Inventors: Gregory G. Freeman, Hopewell Junction, NY (US); Anil K. Chinthakindi, Wappingers Falls, NY (US); David R. Greenberg, White Plains, NY (US); Basanth Jagannathan, Schaumburg, IL (US); Marwan H. Khater, Poughkeepsie, NY (US); John Pekarik, Underhill, VT (US); Xudong Wang, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/908,448

(22) Filed: May 12, 2005

(65) Prior Publication Data

US 2006/0255415 A1    Nov. 16, 2006

(51) Int. Cl.
*H01L 29/76* (2006.01)
(52) U.S. Cl. .............. 257/213; 257/192; 257/E51.006; 257/E27.06
(58) Field of Classification Search ................ 257/213, 257/410, 336, 344, 411, 408, 218, 192, 262, 257/E51.006, E27.06
See application file for complete search history.

(56) References Cited

U.S. PATENT DOCUMENTS 5,998,849 A * 12/1999 Ishimaru et al. ............ 257/410

| | | |
|---|---|---|
| 6,635,909 B2 | 10/2003 | Clark et al. |
| 2002/0140031 A1 | 10/2002 | Rim |
| 2003/0141548 A1 | 7/2003 | Anderson et al. |
| 2003/0178677 A1 | 9/2003 | Clark et al. |
| 2003/0178681 A1 | 9/2003 | Clark et al. |
| 2003/0201458 A1 | 10/2003 | Clark et al. |
| 2004/0097025 A1 | 5/2004 | Fitzgerald et al. |
| 2004/0099903 A1 | 5/2004 | Yeo et al. |
| 2004/0113217 A1 | 6/2004 | Chidambarrao et al. |
| 2004/0173790 A1 | 9/2004 | Yeo et al. |

* cited by examiner

*Primary Examiner*—Hoai V Pham
*Assistant Examiner*—Dilinh Nguyen
(74) *Attorney, Agent, or Firm*—Daryl K. Neff, Esq.; H. Daniel Schnurmann (57) ABSTRACT

A field effect transistor is provided which includes a contiguous single-crystal semiconductor region in which a source region, a channel region and a drain region are disposed. The channel region has an edge in common with the source region as a source edge, and the channel region further has an edge in common with the drain region as a drain edge. A gate conductor overlies the channel region. The field effect transistor further includes a structure which applies a stress at a first magnitude to only one of the source edge and the drain edge while applying the stress at no greater than a second magnitude to another one of the source edge and the drain edge, wherein the second magnitude has a value ranging from zero to about half the first magnitude. In a particular embodiment, the stress is applied at the first magnitude to the source edge while the zero or lower magnitude stress is applied to the drain edge. In another embodiment, the stress is applied at the first magnitude to the drain edge while the zero or lower magnitude stress is applied to the drain edge.

10 Claims, 7 Drawing Sheets

210 - CURVE FOR LOW STRESS FET
212 - Vtlin FOR LOW STRESS FET
214 - Vtsat LOW STRESS FET 220 - CURVE FOR HIGH STRESS FET
222 - Vtlin FOR HIGH STRESS FET
224 - Vtsat HIGH STRESS FET

FIG. 3
(PRIOR ART)

310 - CURVE FOR LOW-STRESS FET
320 - CURVE FOR HIGH-STRESS FET

FIELD EFFECT TRANSISTOR HAVING AN ASYMMETRICALLY STRESSED CHANNEL REGION

BACKGROUND OF THE INVENTION

The present invention relates to semiconductor devices and more specifically to a field effect transistor ("FET") in which a stress is applied to a channel region of the FET.

Increasingly, stressor elements are being incorporated into FET semiconductor devices and/or ancillary structures overlying such devices in order to increase the performance of the FETs. It is known that a compressive stress applied to the channel region of a p-type conductivity FET or "PFET" creates a compressive strain within the semiconductor crystal lattice structure of the channel region which increases the performance of the PFET. On the other hand, a tensile stress applied to the channel region of an n-type conductivity FET or "NFET" creates a tensile strain within the semiconductor crystal lattice structure of the channel region which increases the performance of the NFET. In each case, the stress applied to the channel region creates a strain therein which improves the mobility of charge carriers to improve the transistor's performance.

Typically, FETs within integrated circuits are fabricated as symmetric devices. The drain and the source of the transistor are subjected to the same processing steps. For example, when an ion implantation is made to a side of the FET at which the drain is disposed (the "drain side"), the ion implantation is also made to the side of the FET at which the source is disposed (the "source side"). Thus, when an ion implantation is made at an angle to a drain side of the FET, the ion implantation is mirrored and performed to the source side of the FET as well, to provide a symmetric FET device structure. This permits the FET to be incorporated and utilized in a layout of the integrated circuit without limiting one side of the FET to functioning as only the drain side and limiting the other side of the FET to functioning only as the source side.

Accordingly, in FET structures which incorporate stressor elements, such stressor elements apply stresses to the channel region in essentially equal magnitudes from both a source side and from a drain side of the FET. However, several undesirable side effects are associated with these stresses, which are only now being recognized. One such side effect is reduced bandgap, which manifests itself as a lowering of the threshold voltage. When the bandgap and threshold reduction takes place on the drain side of the FET, this aggravates the effect referred to as drain-induced barrier lowering ("DIBL"). Reduced drain-side bandgap increases the sensitivity of the FET to drain voltage. As a result, when the magnitude of the voltage applied to the drain of the FET increases, the magnitude of the threshold voltage becomes smaller. Consequently, the threshold voltage ("Vt") is different depending on whether the magnitude of the drain to source voltage (|Vds|) has a high value or has a low value.

Figure 1:
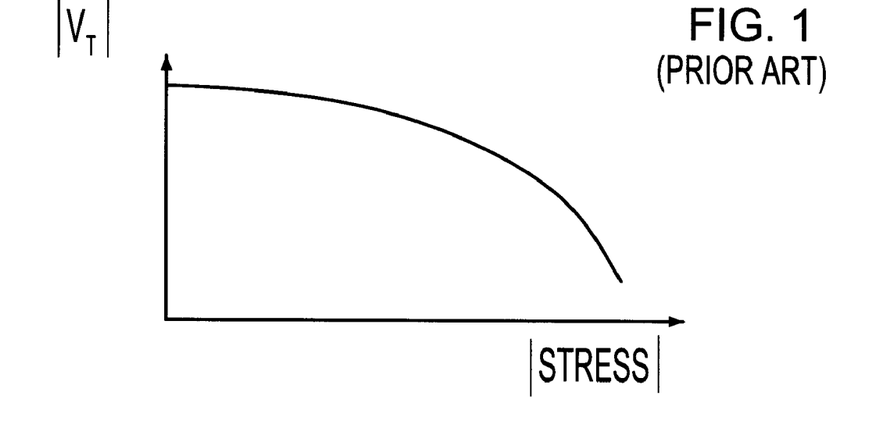
FIGS. 1-3 are diagrams illustrating certain effects of applying stresses to a channel region of an FET.
Figure 2:
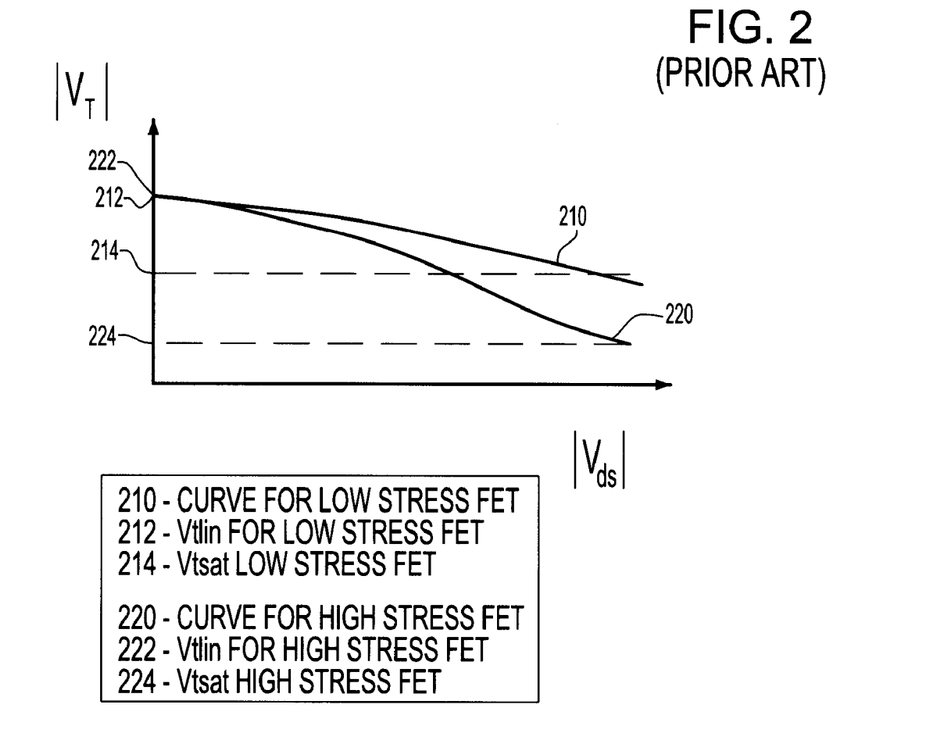

This effect is illustrated in FIG. 2. Curve 210 depicts the change in the magnitude of the threshold voltage (|Vt|) in relation to the magnitude of the drain to source voltage |Vds| for an FET to which no more than a low level of stress is applied to the channel region of the FET. Curve 220 depicts the change in the magnitude of the threshold voltage (|Vt|) in relation to the magnitude of the drain to source voltage |Vds| for an FET to which a high level of stress is applied to the channel region of the FET. For an FET, these values of Vt and Vds are both positive. When Vds is low, Vt is referred to as a "linear Vt" or "baseline Vt" ("Vtlin"). When Vds is at a positive high value for an NFET, the NFET is driven into saturation. At such value, the threshold voltage is referred to as a "saturation Vt" or "Vtsat". As depicted in curves 210 and 220 of FIG. 2, the threshold voltage for both the low-stress FET and the high-stress FET decrease in relation to the magnitude of Vds. In this example, both curves start from one level 212, 222 where Vtlin for the low-stress FET and Vtlin for the high-stress FET are the same. Then, with increasing Vds, the curves decrease to a level at which the value of Vtsat (224) for the high-stress FET is lower than Vtlin (222) and the value of Vtsat (214) for the low-stress FET is lower than its Vtlin (212). The undesirable DIBL side effect can be quantified as a difference between these two threshold voltage values, i.e., expressed as the formula:

Vtsat minus Vtlin.

As can also be seen from FIG. 2, one effect of applying stress to the channel region of the FET from both a source side and a drain side of the FET is that the value of Vtsat (214) reached for the high-stress FET is lower than the value of Vtsat (214) reached for the low-stress FET. This effect represents an increased impact of DIBL upon the high-stress FET, and thus, increased performance degradation for the high-stress FET.

One impact is seen in a relative reduction in performance that results from process steps employed to correct for this effect. FETs are designed to operate with a threshold voltage having a targeted value. FETs are also designed to conduct a targeted amount of current or "on-current" when the FET is fully turned on. In FETs which incorporate stressor elements such as described above, the reduction in the threshold voltage brought about by DIBL must be compensated in order for the transistor to operate with the targeted threshold voltage value. Such compensation can be made by increasing the dopant concentrations of halo regions and/or well regions of the transistor. Unfortunately, increased dopant concentrations in such regions are known to decrease the mobility of charge carriers within the transistor. In view of the foregoing, this leads to paradoxical results in that corrective changes to the FET that are required to compensate for unwanted side effects of the applied stresses cause a decrease in performance which sometimes partially or even completely negates the improvement in mobility brought about by the applied stresses.

Figure 3:
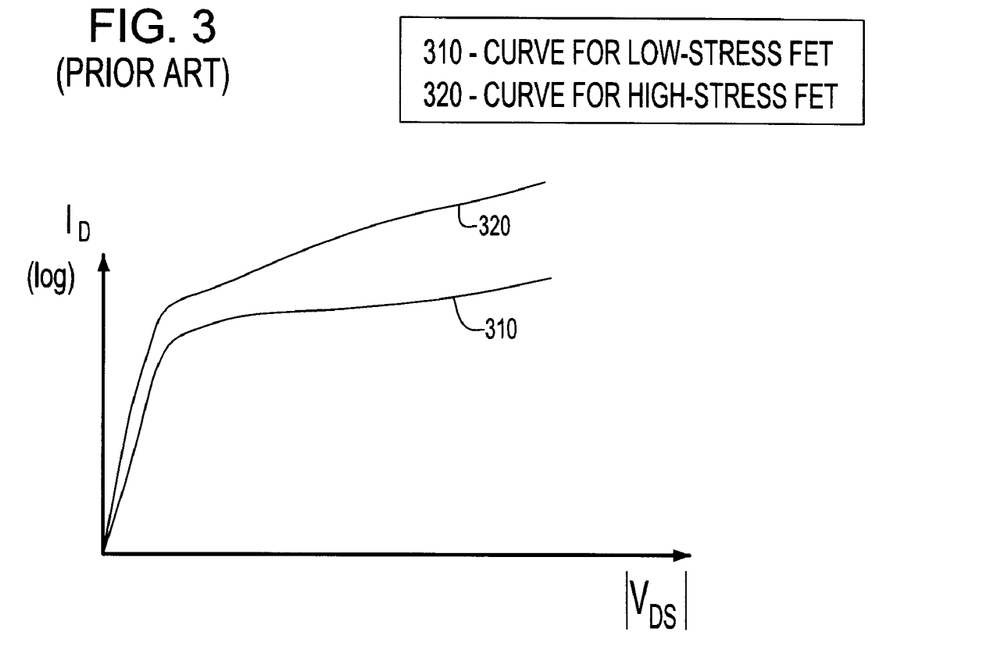

In addition to that described in the foregoing, another side effect of the applied stresses is an increase in the output conductance of the FET, as best seen in FIG. 3. FIG. 3 is a logarithmic plot of the drain current ("Id") of an FET in relation to the drain-source voltage ("Vds") applied to the FET. Curve 310 illustrates a case in which no deliberate effort has been made to impart a stress to the channel region of the FET. Curve 320 illustrates a case in which a stress is imparted to the channel region via stressor elements as described above. Upon comparison of the curves, it is seen that curve 320 exhibits higher output conductance, in that the slope of the curve 320 in the conductive region of operation (at higher levels of Vds) is greater than the slope of the curve 310 for the FET for the transistor which does not have the stresses applied thereto. Lower output conductance, as exemplified by curve 310, which has a flatter characteristic at higher values of Vds is desirable for FETs used in current mirror circuits and for transistors used to provide analog amplification.

Lower output conductance is also desirable for transistors used in PLLs (phase-lock-loops) and those used in output drivers within digital integrated circuits such as microprocessors.

Another undesirable side effect is reduced control of the threshold voltage of the FET. This occurs because the strain produced within the FET channel region by the applied stresses affects the threshold voltage. Moreover, since the magnitude of the strain produced within the channel region is subject to vary due to variations in processing, the achieved threshold voltage is subject to greater variability.

Furthermore, another unwanted side effect that may occur is greater device degradation of the FET due to a mechanism such as negative bias temperature instability or "NBTI".

It should be noted with respect to the foregoing that stresses applied to the channel region of the FET principally increase the low-field mobility. However, this improvement is made without significantly improving the value of carrier saturation velocity "vsat" within the FET. The positive effects of the applied stresses are limited to the source side of the FET. In addition, as discussed above, the negative side effects are limited to the drain side of the FET.

SUMMARY OF THE INVENTION

A field effect transistor is provided which includes a contiguous single-crystal semiconductor region in which a source region, a channel region and a drain region are disposed. The channel region has an edge in common with the source region as a source edge, and the channel region further has an edge in common with the drain region as a drain edge. A gate conductor overlies the channel region. The field effect transistor further includes a structure which applies a stress at a first magnitude to only one of the source edge and the drain edge while applying the stress at no greater than a second magnitude to another one of the source edge and the drain edge, wherein the second magnitude has a value ranging from zero to about half the first magnitude. In a particular embodiment, the stress is applied at the first magnitude to the source edge while the zero or lower magnitude stress is applied to the drain edge. In another embodiment, the stress is applied at the first magnitude to the drain edge while the zero or lower magnitude stress is applied to the drain edge.

DETAILED DESCRIPTION

In many applications of FETs used in integrated circuits, the FET is not operated asymmetrically. In such case, the FET is operated such that one side of the FET always functions as the drain side and another side of the FET always functions as the source side.

In accordance with the embodiments of the invention, an FET is provided which addresses the above-described unwanted side effects that occur in FETs to which stresses are applied to a channel region via stressor elements disposed at both the source side and the drain side of the FET. As provided in accordance with such embodiments, a FET structure is provided in which a stressor element applies a stress at a first magnitude only to a source edge of the channel region of the FET. To the drain edge of the FET channel region, a stress is applied at no more than a second magnitude, the second magnitude being zero or a value which is much less than the first magnitude.

Figure 4:
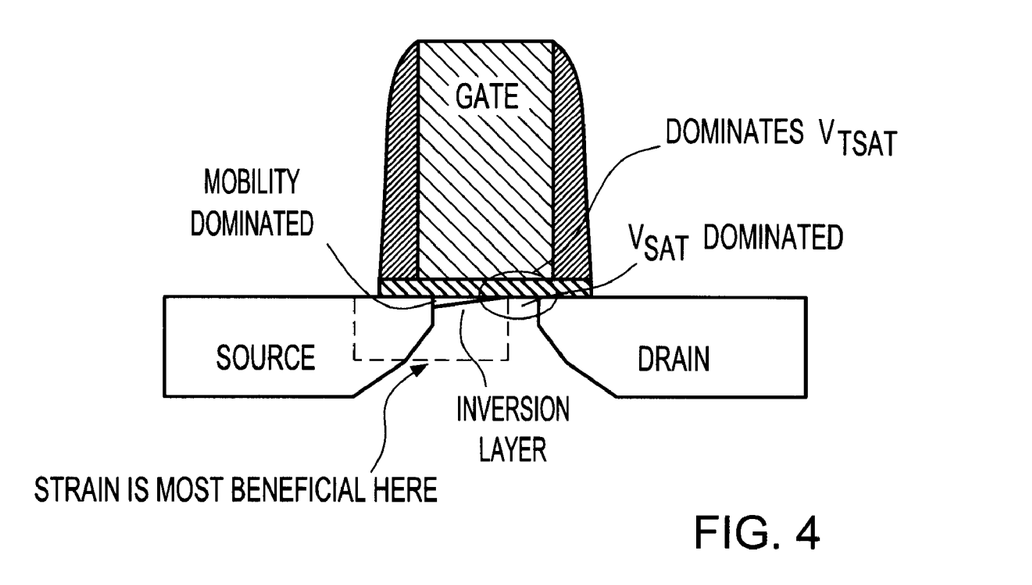
FIG. 4 is a schematic cross-sectional diagram illustrating a structure and operation of an FET.

Such embodiment is provided in recognition of basic principles by which FETs operate, as illustrated with respect to FIG. 4. FIG. 4 illustrates the fact that an FET operates asymmetrically. In such example, when the voltage at the drain of the FET ("Vd") is greater than the difference of the voltage at the gate of the FET ("Vg") over the threshold voltage ("Vt"), i.e., Vd>(Vg-Vt), the channel is separated into a region of inversion or "inversion layer" (which is populated by a large number of carriers) and a region of "pinchoff" (which has been nearly depleted of carriers). In an NFET, electrons are the dominant charge carriers. In a PFET, the dominant charge carriers are holes. In the case of an NFET, these charge carriers, i.e., electrons, originate from the source side of the NFET, enter this heavily populated inversion region and traverse the channel region under low-field mobility approximations. In the case of a PFET, the dominant charge carriers, holes, originate from the source side of the PFET, enter the inversion region and traverse the channel region under low-field mobility approximations. Charge carriers which enter the pinchoff region from the inversion region travel to the drain of the device at approximately, but no greater than a saturation velocity value ("vsat").

In addition, in modern high performance CMOS transistors, the threshold voltage Vt is determined by both the source side and drain side of the transistor, due to "pocket" angled threshold adjust implantation into the channel region from both sides of the gate. The undesirable effects of barrier lowering are found on the drain side of the transistor, since the drain voltage more strongly affects the barrier at that side of the device and thus more strongly modulates DIBL and output conductance of the transistor. With reduced stress on the drain side of the transistor, lower pocket doping is required and consequent negative effects of this pocket doping are reduced.

In order to reduce the above-described unwanted effects, a stress is best applied to the channel region of a FET from only the source side, while ideally leaving the drain side of the FET free of such stress. In this way, zero strain or at most comparatively little strain is induced in the FET and the boundary between the channel region and the drain. In turn, the above-discussed adverse effects on DIBL, output conductance, device degradation, and decreased performance due to increased halo- and/or well doping are minimized. Thus, a positive enhancement to mobility is achieved with little or no adverse effects upon the threshold voltage.

In the embodiments described below, reference is made to the application of a higher-level stress to a side of the FET on which the source region is disposed, i.e., the "source edge", while a reduction of the stress level or elimination of stress is made to the side of the FET on which the drain region is disposed, i.e., the "drain edge". However, nothing in the embodiments described herein negates the desirability or usefulness of the herein-described structures and processes in fabricating an FET in which a higher-level of stress is applied to the drain edge of the FET while the stress level applied to the source edge of the FET is reduced or eliminated. Thus, while the above discussion focuses on certain side effects of applying stresses to both the source and drain of an FET, circumstances exist in which it is desirable to induce certain above-described effects in some FETs by applying a high-level of stress only to the drain edge. As one example, FETs can be used in certain circuits, e.g., static random access memories ("SRAMs"), in which higher output conductance benefits its operation. By the foregoing discussion, such result can be achieved by purposely applying a high level of stress to the drain edge of the FET. Moreover, since FETs formed according to the herein-described processes can be oriented in different positions during their fabrication and can be connected within circuits according to different connections schemes, the processes described herein for fabricating FETs having higher-level stress at a source edge and comparatively little stress at the drain edge can be used to fabricate FETs which have higher-level stress at the drain edge and comparatively little stress at the source edge. At most, the structures and processes described below are modified by interchanging the terms relating to the source region and drain region of the FET.

Figure 5:
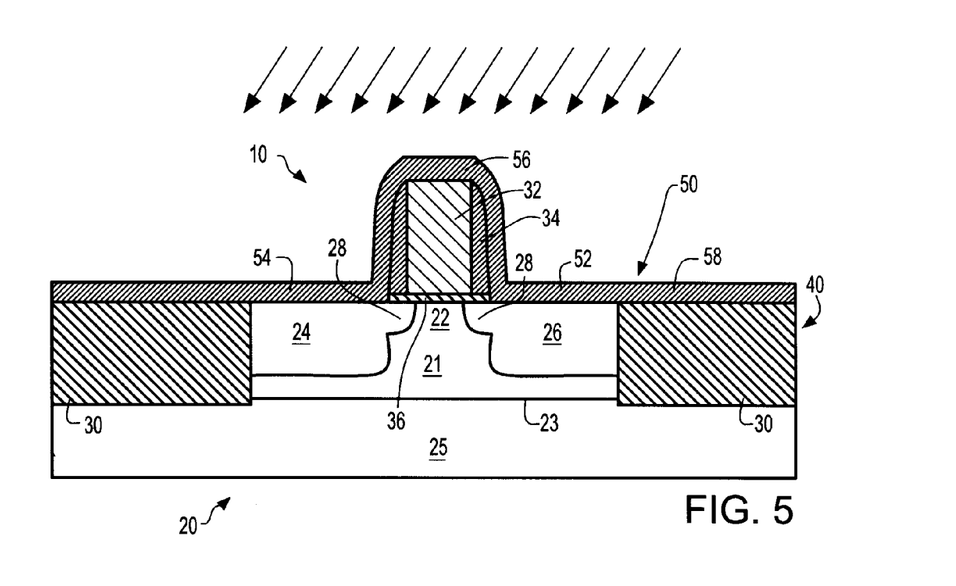
FIGS. 5-6 illustrate a structure and process for forming an FET having an asymmetrically stressed channel region according to one embodiment of the invention.
Figure 6:
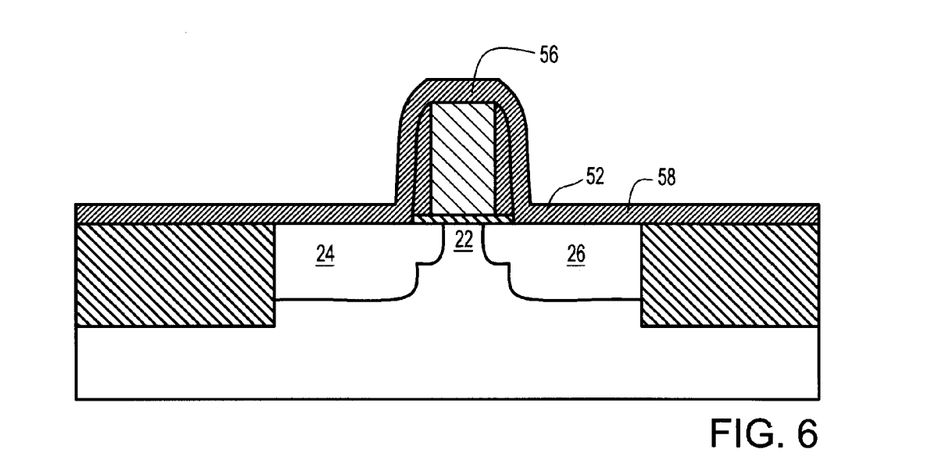
Figure 7:
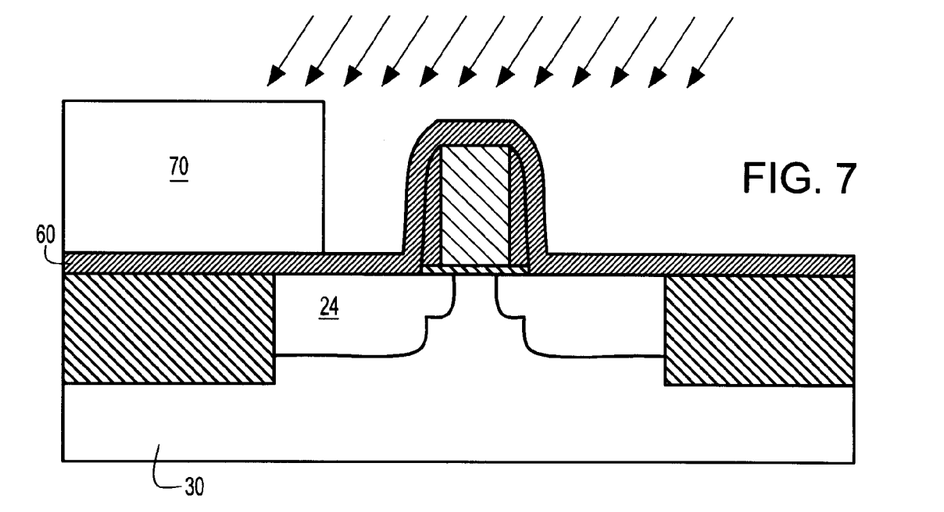
FIG. 7 illustrates a structure and process for forming an FET having an asymmetrically stressed channel region according to a variation of the embodiment illustrated in FIGS. 5-6.

FIGS. 5 through 7 illustrate a method according to a first embodiment of fabricating an FET having a mobility-enhancing stress applied only to a source side of the FET. In this embodiment, the stress is applied to the channel region of the FET by way of a stressed dielectric layer overlying a single-crystal semiconductor region in which the source region, channel region and drain region of the FET are provided. The principle of this embodiment is to provide the stressed dielectric layer covering both the source side and the drain side of the FET while reducing the stress applied by the dielectric layer to the drain side of the FET.

As illustrated in FIG. 5, an FET structure 10 is illustrated which includes a single-crystal semiconductor region 20, typically consisting essentially of silicon or an alloy of silicon with another semiconductor such as silicon germanium, silicon carbide or other semiconducting alloy. Preferably, the single-crystal semiconductor region 20 consists essentially of silicon. Alternatively, the single-crystal semiconductor region 20 consists essentially of a compound semiconductor, e.g., as a III-V compound semiconductor of which GaAs and InP are examples. Preferably, the FET structure 10 is formed as one transistor of an integrated circuit which includes many such FET structures 10, e.g., from several such FETs to millions or even billions of such FETs.

The single-crystal semiconductor region 20 is a defined active region of a substrate 40, and is preferably bounded by a shallow trench isolation region 30, typically consisting essentially of an oxide material deposited, e.g., via high density plasma deposition ("HDP") into an etched opening. The opening may or may not be lined with a diffusion barrier such as silicon nitride, for example. Within the single-crystal semiconductor region 20, a well region is provided in an upper portion 21 above a line 23 which marks a boundary between the well region 20 and a bulk region of the substrate 40.

In an alternative embodiment (not shown), the substrate 40 is a semiconductor-on-insulator substrate, especially a silicon-on-insulator ("SOI") substrate. In such case, the single-crystal semiconductor region 20 is disposed only above line 23 as a silicon-on-insulator ("SOI") layer, and line 23 marks the boundary between the SOI layer and a buried dielectric or buried oxide layer which is disposed below line 23.

The well region 21 has a first dopant type and concentration. For instance, when the FET structure is an NFET, the well region 21 is doped p-type and typically has a dopant concentration having a nominal value selected by design to fall within a range of between about $10^{16}$ cm$^{-3}$ and $10^{17}$ cm$^{-3}$. The FET structure 10 further includes a gate conductor 32 composed, for example, of one of more of doped semiconductors, metals and conductive compounds of metals, the gate conductor 32 being separated from the channel region 22 by a gate dielectric 36, which may be thermally formed from the semiconductor or deposited. As depicted, dielectric spacers 34 may be present on sidewalls of the gate conductor 32. However, such spacers 34 are not required for some types of FETs in accordance with embodiments of the invention.

Within the portion of the single-crystal semiconductor region above line 23, a source region 24 and a drain region 26 are disposed, both having n-type conductivity and both having a dopant concentration which is typically about $10^{18}$ cm$^{-3}$ to $10^{20}$ cm$^{-3}$. The source region 24 and drain region 26 are typically formed via counterdoping portions of the well region 21 in a manner which is self-aligned to the gate conductor 32, any dielectric spacers 34 and any additional disposable dielectric spacers which may be present thereon. Preferably, extension and/or halo regions 28 extend from the source region 24 and drain region 26 to underlie portions of the gate dielectric 36, as illustrated in FIG. 5.

As further shown in FIG. 5, a stressed dielectric layer 50 is provided which overlies the FET structure 10, such layer 50 having an internal stress which produces a like type of stress within the channel region 22 of the FET. In one example, a stress having a magnitude from some tens of MPa up to several GPa or tens of GPa is applied to the channel region at its edges, i.e., at respective boundaries of the channel region 22 with the source region 24 and with the drain region 26, including the extension regions 28 thereof, as shown.

In this example, in which the FET 10 is an NFET, the stressed dielectric layer 50 has an internal tensile stress, which effectively applies a tensile stress to the channel region 22 of the FET 10. As an example of such stressed dielectric layer 50, both silicon nitride and silicon oxide can be deposited to retain a stress. Preferably, most or all high temperature processing of the FET 10, e.g., dopant drive-in processes and any required anneals, are performed prior to the deposition of the stressed dielectric layer 50 because the stress within such layer tends to become relaxed at high temperatures. As first formed, the stressed dielectric layer 50 has the same internal stress in both a "drain portion" 52, which overlies the drain region 26, and in a "source portion" 54, which overlies the source region 24.

Then, as further shown in FIG. 5, the FET structure 10 is subjected to an implantation process for the purpose of reducing the magnitude of the stress within the stressed dielectric layer 50. The implantation of ions and/or particles of a material included in or similar to the composition the single-crystal semiconductor region 20 most strongly affect the magnitude of the stress within the stressed layer 50 without materially affecting the structure or operational parameters of the FET 10. In one embodiment, such implantation is performed by implantation of germanium ions, silicon ions or other ions or particles. Preferably, germanium ions or silicon ions are implanted. Such implantation process is performed with the goal of disproportionately lowering the magnitude of the stress within the drain portion 52 of the stressed layer in relation to the stress which exists in the source portion 54 of the stressed layer.

Thus, in the particular embodiment illustrated in FIG. 5, an implantation process is performed with the ions or particles directed at an angle to the FET 10 such that substantially all of the drain portion 52 of the stressed layer 50 is implanted by this process, as well as an exposed portion 56 of the stressed layer overlying the gate conductor structure and the exposed portion 58 of the stressed layer which overlies the STI region 30 adjacent to the drain portion 52.

As shown in FIG. 6, the effect of the implantation is to reduce the stress within the implanted portions 52, 56 and 58 of the stressed layer such that the stressed layer no longer applies a stress of the original magnitude to the channel region 22 from the side of the drain 26. Ideally, the stress applied to the channel region from the drain side is reduced to a value which is essentially zero, much less than, or at minimum, significantly less than the original magnitude. At the same time, however, the source portion 54 of the stressed layer continues to apply a stress to the channel region 22 at a magnitude sufficient to beneficially increase mobility within the FET 10. At minimum, the achieved reduction in stress at the drain side of the FET should result in a final stress level which is less than or equal to about half the magnitude of the stress at the source side of the FET. As a result of the above-described implantation process, a high magnitude stress caused by a stressed dielectric layer of a FET structure 10 is applied from only a source portion of the layer to the FET channel region, while the stress applied to a drain side of the FET is reduced to zero or to a sufficiently low magnitude which produces, at best, negligible impact to the above-described performance parameters, and, at worst, is a manageable stress which produces little impact to those parameters.

FIG. 7 illustrates a variation of the embodiment described above relative to FIGS. 5-6. As shown in FIG. 7, in this variation a source adjacent portion 60 of the stressed layer overlying the STI region 30 adjacent to the source region 24 is masked, e.g., by a patterned photoresist layer, prior to the implantation process. As a result, when the implantation process is performed, the source adjacent portion 60 of the stressed layer is protected from the implantation. Consequently, the source adjacent portion 60 continues to remain internally stressed at a magnitude close to or equal to the original magnitude. As a result, the source adjacent portion 60 helps to prevent the source portion 54 of the stressed layer from becoming relaxed, thereby retaining the magnitude of the stress within the source portion 54 at a higher level after the implantation process.

Figure 8:
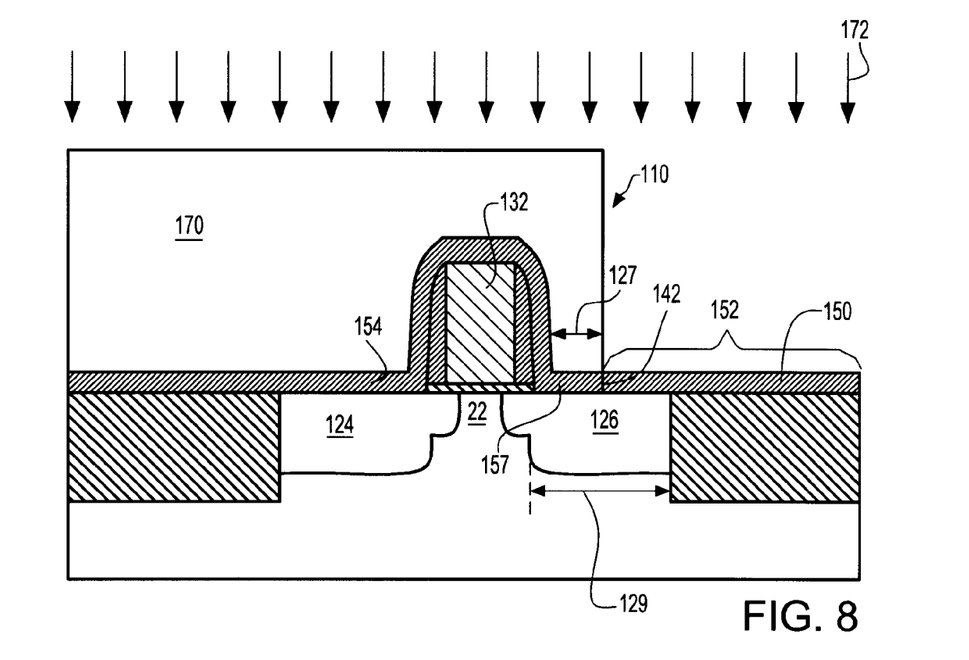
FIG. 8 illustrates a structure and process for forming an FET having an asymmetrically stressed channel region according to another embodiment of the invention.

FIG. 8 illustrates another embodiment for producing a FET structure 110 in which a beneficial high magnitude stress is applied to a channel region of the FET from a source side thereof, without applying a stress of the same magnitude to the drain side of the FET 10, thus avoiding the above-described ill effects on the drain side of the FET. As shown in FIG. 8, an FET structure 110 has a structure such as that described above with reference to FIGS. 5 and 6, as does a stressed dielectric layer 150 which is provided to overlie the FET structure 110. A masking layer such as a photoresist layer 170 is deposited and patterned to cover the source region 124 of the FET structure 110, as well as a gate conductor 132 thereof, and may also extend beyond the gate by a small amount 127 (preferably the smallest dimension allowed by pattern overlay tolerance, which is comparable to the smallest lateral dimension of the gate conductor 132).

The masking layer is not specifically required to cover a portion of the width of the drain region, so long as it sufficiently covers the stressed layer 150 overlying the source region 124 to protect it from subsequent processes. The masking layer 170 is shown covering a portion of the drain region 126 of the FET 110 because it is difficult to exert sufficient control over the lithography to have the edge of the masking layer 170 land at a location overlying the gate conductor 132. This is especially true when the width of the gate conductor is small (e.g., less than 120 nm) as it is in accordance with advanced semiconductor structures.

In one embodiment of the invention, the masking layer 170 is used to define a boundary 142 between a portion 152 of the stressed layer 150 which receives a non-angled implant and another portion 154 of the stressed layer 150 which does not. Implanting is performed using ions or particles as described above, but in which the angle of incidence which is substantially normal to the surface of the channel region 22 at the gate dielectric 136. After the implanting process, the masking layer 170 is removed. As a result of such implant, the stress within the exposed portion 152 becomes relaxed, i.e., is reduced to a negligible magnitude or much lower magnitude, similar to that described above with reference to FIG. 6. In addition, because of its proximity to the exposed portion 152, the portion 157 of the stressed layer adjacent to the exposed portion is substantially relaxed. As a result, the portion 157 no longer applies a stress close to the original magnitude and, therefore, does not produce deleterious effects of similar magnitude to that described above in the background.

Figure 9:
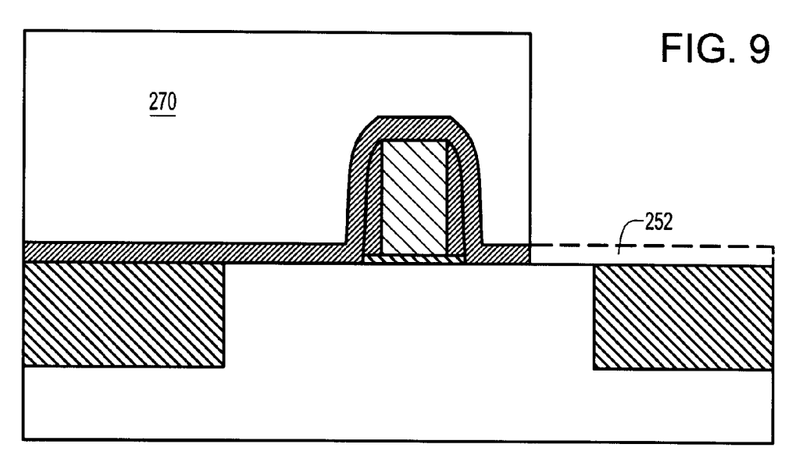
FIG. 9 illustrates a structure and process for forming an FET having an asymmetrically stressed channel region according to still another embodiment of the invention.

FIG. 9 illustrates yet another embodiment which is similar to that shown and described in FIG. 8, but in which, instead of performing an implant, a portion 252 of the stressed layer (shown in dotted outline) is removed where it is not covered by the masking layer 270 to provide results which are similar to those obtained in that embodiment.

FIGS. 10-14 illustrate yet another embodiment of the invention in which the FET 310 (FIG. 10) incorporates a stressor element 350 disposed within the single-crystal semiconductor region 320 of the FET 310 for applying a stress to the channel region 322 only from a side of the channel region 322 in which the source 324 is disposed. As in the above-described embodiments, the FET structure may be a basic FET structure, having a gate conductor 332, sidewall spacers 334 disposed thereon, and a drain region 326 disposed on a side of the channel region 322 opposite the source region 324. The FET 310 may also include additional features such as additional dielectric spacers 336 or other dielectric features disposed on sidewalls of the gate conductor 332 or the sidewall spacers 334, and may also include regions 338, 339 including one or more conductive silicides and/or metals overlying the major surface 312 of the source region 324, the drain region 326 and/or the gate conductor. Additional features of FET structures which are understood to be present in integrated circuits such as an interlayer dielectric region and conductive contact structures to the FET are omitted for ease of reference and illustration.

Figure 10:
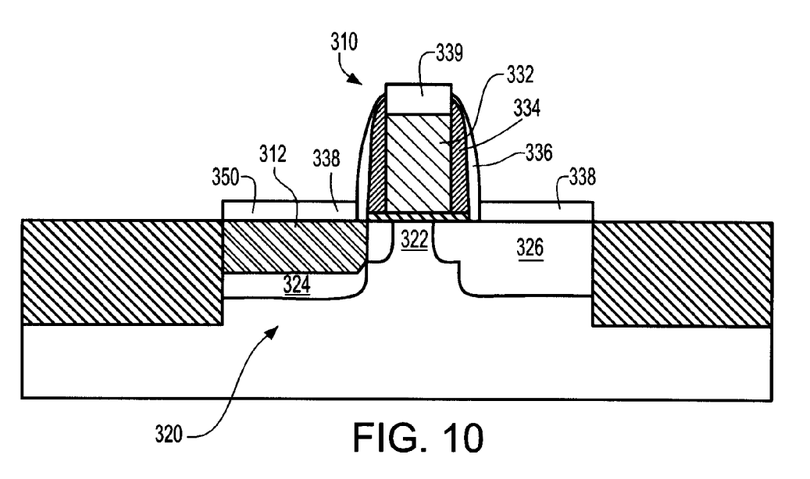
FIGS. 10-14 illustrate a structure and process for forming an FET having an asymmetrically stressed channel region according to yet another embodiment of the invention.

In an exemplary embodiment, the channel region 322 and the drain region 326 of the FET are provided in a single-crystal semiconductor region 320 which consists essentially of a silicon crystal. In such embodiment, the stressor element 350 is embodied by a region of a single-crystal semiconductor material epitaxially grown within a recess in the single-crystal semiconductor region 320 formed prior thereto which is adjacent to the location of the channel region. Preferably, the stressor element consists essentially of an alloy of silicon with another semiconductor such as germanium or carbon for which the size of the crystal lattice or its structure varies from that of the single-crystal semiconductor region 320. As a result, the juxtaposition of the epitaxially grown semiconductor material of the stressor element 350 to the single-crystal semiconductor region 320 produces a stress within the stressor element 350 which is exerted upon the juxtaposed semiconductor region 320. Through appropriate control of the composition of the semiconductor material of the stressor element 350 and the process by which it is epitaxially grown, the stressor element can be made to either apply a tensile stress or a compressive stress.

Alternatively, when the FET 310 is an NFET, the stressor element is constructed to apply a tensile stress to the channel region of the NFET to benefit the mobility of electrons therein. In such case, the stressor element 350 may include an alloy of silicon and carbon because such alloy results in a lattice structure smaller than that of pure silicon and, therefore, exerts a tensile stress upon the silicon region with which it is juxtaposed.

When the FET 310 is a PFET, the stressor element is constructed to apply a compressive stress to the channel region to benefit the mobility of holes therein. In such case, the stressor element is embodied by a region of silicon alloyed with a semiconductor such as germanium which results in a lattice structure larger than that of pure silicon. As one example, the stressor element can include silicon and germanium in proportions according to a formula $Si_xGe_{1-x}$, in which "x" specifies a proportion by atomic fraction of silicon. Preferably, the proportion of silicon "x" ranges between about 0.90 to 0.70.

Figure 11:
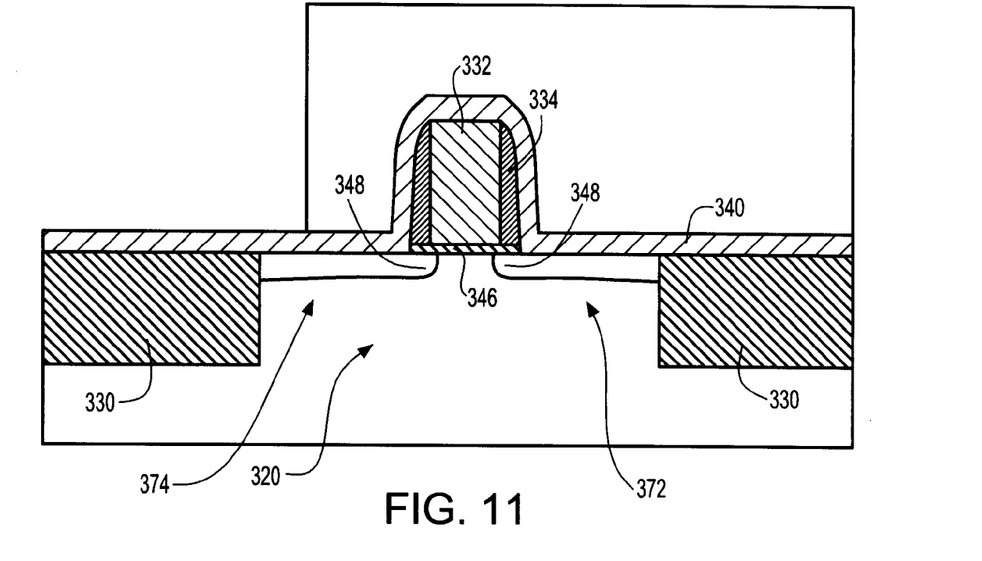

An exemplary method of fabricating such FET is illustrated in FIGS. 11-14. FIG. 11 illustrates a stage of processing which includes pre-processing to form one or more STI regions 330 which define the boundaries of the active single-crystal semiconductor region 320, as well as processing to form a gate dielectric 346, gate conductor 332 and sidewall spacers 334 of the gate conductor. Preferably, implants used to form extension and/or halo regions are performed in processing at this stage. After such processing, optionally, an etch-distinguishable sacrificial layer (not shown) of a material such as silicon nitride, is deposited to cover the single-crystal semiconductor layer 320. A thin layer 340 including a dielectric material such as silicon dioxide is then deposited over the structure, as shown in FIG. 11. Ideally, the deposited layer 340 exhibits a greater etch rate compared to the materials present in the structure underlying it, particularly, the sidewall spacers 334 (which preferably consist essentially of silicon nitride), the gate dielectric (which preferably is a thermally grown silicon dioxide layer), and the silicon dioxide fill within the STI regions 330 (which are preferably formed by a high density plasma deposition). For this reason, the process used to deposit oxide layer 340 should result in a low density oxide material. A deposition process using ozone and a tetraethylorthosilicate ("TEOS") precursor or similar process produces an oxide layer having the requisite low density.

Following the deposition of the oxide layer 340, a masking layer 370, including a patterned layer of photoresist, for example, is formed to cover the gate conductor 332 and a side 372 of the structure where the drain region is to be formed later. Such layer 370 is patterned to expose at least a portion of another side 374 of the structure in which the source region is to be formed. The layer 370 need only cover the side 372 and some portion of the gate conductor 332. Nominally, the masking layer 370 covers a portion of the side 374 for the sake of assuring that side 372 is fully covered, when process tolerances are considered.

Figure 12:
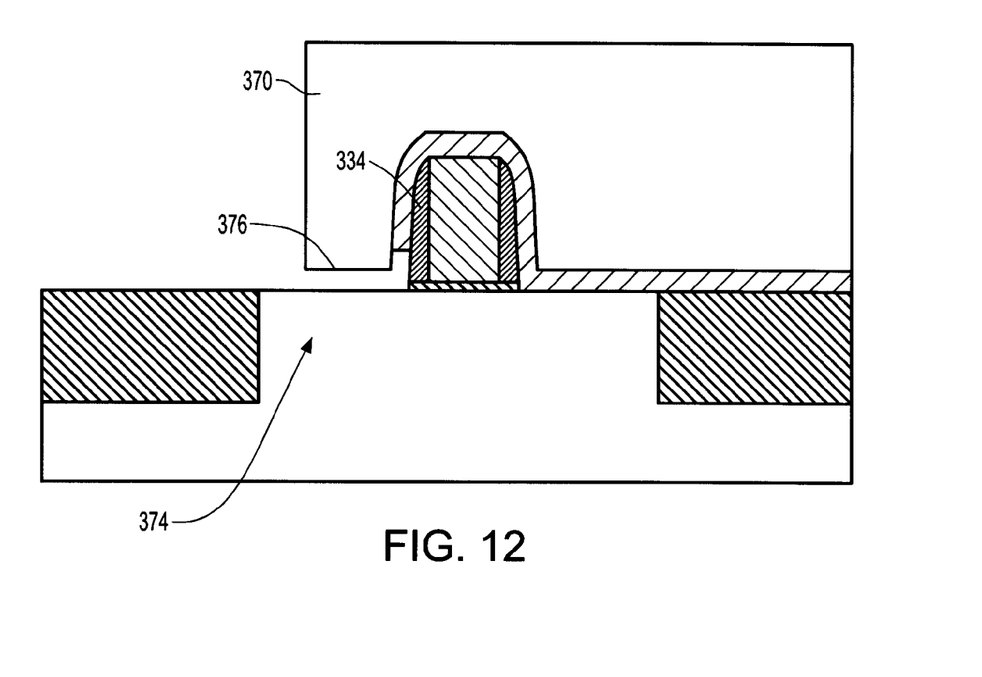

Thereafter, as illustrated in FIG. 12, an isotropic etch process, e.g., a wet etch process, is applied to remove a portion of the deposited oxide layer underlying the exposed edge of the masking layer. Such etch can be permitted to extend upwardly along the sidewall of the gate sidewall spacers 334 to distances which can vary within process tolerances. The process illustrated in FIG. 12 allows for such variability while assuring that the single-crystal semiconductor region at the source side 374 of the structure is exposed fully by the wet etch process to the edge of the gate sidewall spacer 334.

Figure 13:
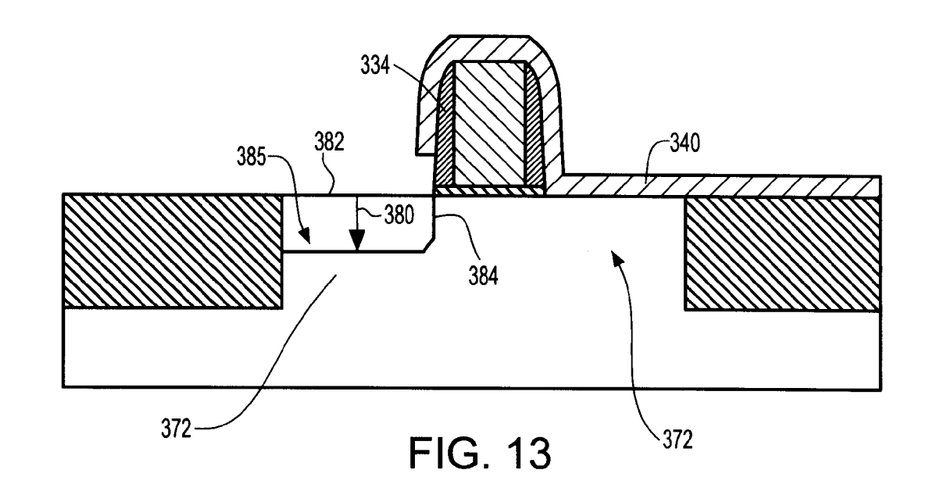

Thereafter, as illustrated in FIG. 13, the masking layer 370 is removed, and an anisotropic etch process, e.g., a reactive ion etch ("RIE") process is applied to etch the source side 374 of the single-crystal semiconductor region 320 to a desired depth below the plane defined by the major surface of the semiconductor region 320. The depth of this etch process is preferably selected to be between 15 nm and 100 nm, although other depths which lie outside this range can be workable for particular devices. During such etch, the oxide layer 340 functions to protect the drain side 372 from etching or other damage. As a result of this etch process, a recess 385 is formed which extends to an edge 384 of the single-crystal silicon region 320 which is aligned to the sidewall spacer 334.

Figure 14:
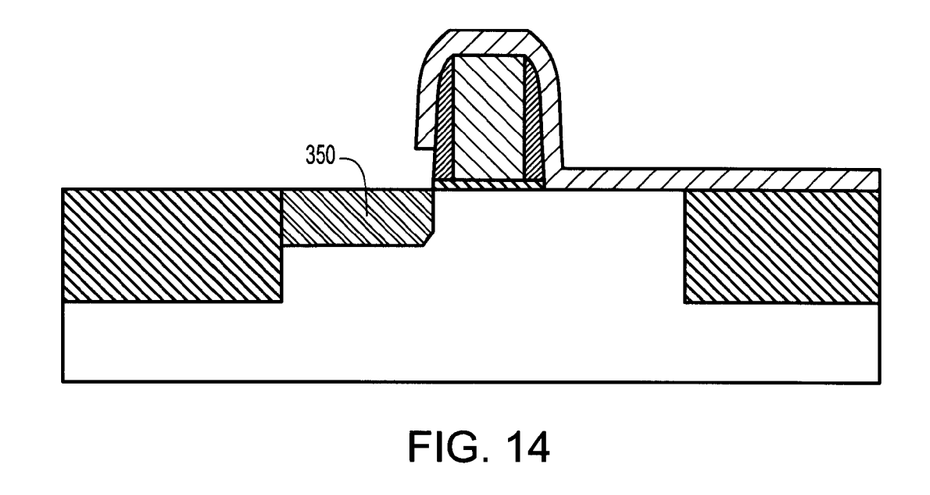

Thereafter, as illustrated in FIG. 14, while the oxide layer 340 remains in place, the stressor element 350 including a region of an alloy of silicon with another semiconductor (as described above) is epitaxially grown within the recess 385, as by a selective epitaxial growth process. Specifically, when a PFET is to be fabricated, a SiGe region is epitaxially grown to form the stressor element 350. Otherwise, when an NFET is to be fabricated, a region of silicon carbon is grown within the recess to form the stressor element.

Referring again to FIG. 10, following the formation of the stressor element 350, the oxide layer 340 is fully removed, and additional processing is performed to complete the FET structure 310 which is described above. Among such additional processing, implants used to form the drain region 326 and a source region 324 encompassing both the stressor element 350 and an underlying portion of the silicon region can now be performed.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. An asymmetrically stressed field effect transistor, comprising:

a contiguous single-crystal semiconductor region including a source region, a channel region and a drain region, said channel region having an edge in common with said source region as a source edge, said channel region further having an edge in common with said drain region as a drain edge, said drain edge being remote from said source edge;

a gate conductor overlying said channel region; and a stressor element applying a stress to a first edge selected from said source edge and said drain edge, such that, at said first edge the stress having a first magnitude is applied, and at a second edge a stress having a second magnitude no greater than half said first magnitude is present, said second edge being one of said source edge and said drain edge other than said first edge.

2. The field effect transistor as claimed in claim 1, wherein said stress having said first magnitude is applied to said drain edge and said stress having said second magnitude is present at said source edge.

3. The field effect transistor as claimed in claim 1, wherein said stress having said first magnitude is applied to said source edge and said stress having said second magnitude is present at said drain edge.

4. The field effect transistor as claimed in claim 3, wherein said stressor element includes a stressed film overlying at least said source region, said stressed film having an opening exposing at least a portion of said drain region.

5. The field effect transistor as claimed in claim 3, wherein said stressor element includes a film including a source portion and a drain portion, said source portion of said film overlying at least a portion of said source region to apply said fist magnitude stress to said source edge, said drain portion overlying at least a portion of said drain region adjacent to said drain edge, said drain portion of said film including an implantation not present in said source portion at a location adjacent to said source edge such that said drain portion applies no greater than said second magnitude stress to said drain edge.

6. The field effect transistor as claimed in claim 3, wherein said contiguous single-crystal semiconductor region includes a first portion disposed in said channel region and said drain region, said first portion having a first lattice constant, said single-crystal semiconductor region including a second portion not disposed in said drain region, said stressor element including said second portion of said single-crystal semiconductor region, said second portion having a second lattice constant different from said first lattice constant such that said second portion applies said first magnitude stress to said source edge.

7. The field effect transistor as claimed in claim 6, wherein said first portion at least partly underlies said second portion.

8. The field effect transistor as claimed in claim 6, wherein said single-crystal semiconductor region is a semiconductor-on-insulator region separated from a bulk region of a substrate by a buried dielectric layer, wherein said second portion extends to a top edge of said buried dielectric layer.

9. The field effect transistor as claimed in claim 8, wherein said second portion of said single-crystal semiconductor region extends throughout said source region.

10. A field effect transistor, comprising:
a contiguous single-crystal semiconductor region including a source region, a channel region and a drain region, said channel region having an edge in common with said source region as a source edge, said channel region further having an edge in common with said drain region as a drain edge;
a gate conductor overlying said channel region; and
a film overlying at least a portion of said source region, said film applying a stress having a first magnitude to said source edge, and said film applying a stress having a second magnitude less than about half said first magnitude to said drain edge.

* * * * *